United States Patent [19]

Hatsuda

[11] Patent Number: 5,289,414
[45] Date of Patent: Feb. 22, 1994

[54] COMPARATOR

[75] Inventor: Tsuguyasu Hatsuda, Neyagawa, Japan

[73] Assignee: Matsushita Electric Industrial Co., Ltd., Osaka, Japan

[21] Appl. No.: 951,166

[22] Filed: Sep. 25, 1992

[30] Foreign Application Priority Data

Sep. 27, 1991 [JP] Japan ............................ 3-248842
Mar. 31, 1992 [JP] Japan ............................ 4-076479

[51] Int. Cl.$^5$ ............................................... G11C 7/00
[52] U.S. Cl. ............................ 365/189.07; 365/190; 307/530
[58] Field of Search ............ 365/189.07, 190, 154, 365/156, 203, 205, 207, 208; 307/355, 530, 471; 340/146.2

[56] References Cited

U.S. PATENT DOCUMENTS 4,041,326 8/1977 Robinson ........................... 307/471
5,134,319 7/1992 Yamaguchi ........................ 307/530

OTHER PUBLICATIONS

H. Marjima et al; "Circuit Technologies for BiCMOS VLSI's Computer Elements", Proceedings, 1989 IEEE Conference on Computer Design. VLSI in Computers & Processors, pp. 318-322.

Primary Examiner—Eugene R. LaRoche
Assistant Examiner—A. Zarabian
Attorney, Agent, or Firm—Ratner & Prestia

[57] ABSTRACT

A comparator for comparing the voltage of an address pair signals in complement with the voltages of bit pair signals in complement includes a pair of transistors for receiving the bit pair signals and a pair of MOSFETs for receiving the address pair signals. One transistor and one MOSFET are connected in series to define a first current path and other transistor and other MOSFET are connected in series to define a second current path. When the address signal and the bit signal are the same, both the first and second current paths close, but when they are different; either the first or the second current path opens to permit a current to pass therethrough. By detecting the current in the path, the coincidence and non-coincidence between the address pair signals and bit pair signals are detected.

7 Claims, 16 Drawing Sheets

COMPARATOR

BACKGROUND OF THE INVENTION

1. Field of the Invention

The present invention relates to a high speed comparator used in microprocessor cache memories and translation look-aside butter (TLB) devices.

2. Description of the Prior Art

An conventional microprocessors, plural bit comparators are used for cache memory tagging and for TLBS. One example of a conventional 24-bit comparator used as a cache memory tag unit is shown in FIG. 14. The tag memory 1401 is accessed by the input address PA 1410 (PA represents physical address), which is decoded by the decoder 1402. When the word line WL 1411 voltage is HIGH, the data stored in the memory cell array selected by the HIGH word line WL 1411 is output to the bit line pair thereof. When the sense enable line SEN 1412 becomes HIGH, the data from the tag memory is read out as address B [23:0] by the sense amplifier 1403. Here, (23:0) indicates that there are 24 bit lines 0, 1, 2, ... 23 for address B.

Bach bit in address A [23:0] 1413 from the central processing unit (CPU) and B [23:0] is compared in the coincidence circuit 1404 for detecting whether the bit line signal from address A and the corresponding bit line signal from address B coincide with each other, or not, The coincidence circuit 1404 is formed by an exclusive NOR (XNOR; logical inverse of the exclusive logical sum) gate, and the coincidence/non-coincidence of all corresponding bits is detected by the AND circuit 1405. The hit signal line HIT 1414 becomes HIGH when all bit lines are coincident, and LOW when one or more bit lines is non-coincident. The cache memory RU controls data input/output using this bit line signal.

The precharge/equalization circuit 1406 is controlled by the precharge enable PCEN 1415 and equalize enable EQEN 1416 signals to precharge and equalize the bit line pairs when the tag memory is not accessed. An N-channel MOSFET device is used as the precharge circuit to increase the speed of the read and precharge/equalization operations.

The write circuit 1407 for writing data W [23:0] 1418 is controlled by the write enable WEN 1417 signal.

A differential sense amplifier using a bipolar transistor with a high transconductance (gm) is used as the sense amplifier circuit 1403 to achieve a high read speed in the memory circuit. An example of this differential sense amplifier is shown in FIG. 15.

Referring to FIG. 15, the bit line pair B 1511 and NB 1512 are the inputs to the emitter follower circuits 1501, 1502. Two NPN transistors 1503, 1504 form the differential sense amplifier. The current-switching N-channel MOSFET 1505 operates only when the sense enable signal 1515 is HIGH, and operates then as a constant current supply device. A load resistance 1506, 1507 is provided for each differential sense amplifier, and data is output to the data output 1516.

In general, a circuit built with bipolar transistors has a low input impedance. A high base current is output when the bipolar transistor is saturated, and the load on the circuit connected to the base, i.e., the bit line, increases. As a result, there is the danger of the wrong data being written to the memory cell when there is much noise signal in the power supply or ground line because there will be a significant voltage drop even with the HIGH bit line during memory reading. Since the emitter follower circuit has a high input impedance, low output impedance, and high current gain as shown in FIG. 15 (1501, 1502), the emitter follower circuit is used to avoid this by reducing the bit line load. In addition, because a voltage that is the internal voltage Vbe between the base and emitter less than the bit line voltage is input to the base of the NPN transistor in the differential sense amplifier, the differential sense amplifier NPN transistor is not as easily saturated.

With the prior art as described above, three steps must be completed before the bit signal is generated, specifically, (1) tag reading, (2) per-bit coincidence/non-coincidence comparison of the address B [23:0] read from the tag memory and the address A [23:0] from the CPU, and (3) coincidence/noncoincidence comparison of all bits. As a result, this increases the time required between reading from the tag memory and hit signal generation. In particular, the number of gates and the delay time both increase because the multiple-bit data signal is compacted to a 1-bit signal in steps (2) and (3).

Furthermore, the addition of an emitter follower circuit increases the number of bipolar transistors, and thus increases the size of the sense amplifier. The effective size of bipolar transistors requiring a separation area between other bipolar transistor cannot be reduced as much as MOSFET devices can, even when the degree of integration increases, and it therefore becomes impossible to keep the memory cells and sense amplifiers proportionally reduced sized. As a result, it is not possible to provide a large-scale sense amplifier for each bit in a TLB or tag memory requiring simultaneous reading of many bits.

SUMMARY OF THE INVENTION

Therefore, the object of the present invention is to provide a high speed comparator featuring a sense function and comparison function achieved in a small hardware.

A comparator according to the present invention compares, in response to an activation signal, the voltages of first and second signals in complement with the voltages of third and fourth signals in complement, and according to one embodiment comprises: a first bipolar transistor for receiving the third signal to a base thereof; a second bipolar transistor for receiving the fourth signal to a base thereof; a first PET for receiving the second signal to a gate thereof, the first bipolar transistor and the first PET being connected in series to form a first current path; a second FET for receiving the first signal to a gate thereof, the second bipolar transistor and the second FET being connected in series to form a second current path, the first current path and the second current path connected in parallel; a switching FET having a drain connected to emitters of the first and second bipolar transistors and a source connected to ground, and being turned on during when the activation signal is in a first state; a load resistor means connected to a junction of drains of the first and second PETS; and a precharge means for precharging collectors of the first and second bipolar transistors during when the activation signal is in a second state.

In operation, when the first and third signals are in the sane state and at the same time, the second and fourth signals are in the same state, the junction produces a first level signal, and when the first and third signals are in the opposite state and, at the same time, the second and fourth signals are in the opposite state, the junction produces a second level signal.

A comparator according to another embodiment of the present invention comprises: an exclusive NOR comprising first, second, third and fourth inputs for receiving the first, third, second and fourth signals, respectively, and first and second outputs, the first and second outputs are connected when the first and third signals are in the same state, and the first and second outputs are disconnected when the first and third signals are in the opposite state, an exclusive OR comprising fifth, sixth, seventh and eighth inputs for receiving the first, fourth, second and third signals, respectively, and third and fourth outputs, the third and fourth outputs are connected when the first and third is signals are in the opposite state, and the third and fourth outputs are disconnected when the first and third signals are in the same state; a first bipolar transistor having base and collector connected to the first and second junctions, respectively; a second bipolar transistor having base and collector connected to the third and fourth junctions, respectively; a switching FET having a drain connected to emitters of the first and second bipolar transistors and a source connected to ground, and being turned on during when the activation signal is in a first state; a first load resistor means connected to the second junction; and a second load resistor means connected to the fourth junction.

In operation, when the first and third signals are in the same state and, at the same time, the second and fourth signals are in the same state, the first and second bipolar transistors are turned on and off, respectively, and when the first and third signals are in the opposite state and, at the same time, the second and fourth signals are in the opposite state, the first and second bipolar transistors are turned off and on, respectively.

A comparator according to yet another embodiment of the present invention comprises: an exclusive OR comprising first, second, third, and fourth inputs for receiving the first, fourth, second and third signals, respectively, and first and second outputs, the first and second outputs are connected when the first and third signals are in the opposite state, and the first and second outputs are disconnected when the first and third signals are in the same state; a switching PET means for connecting the first junction to ground and the second junction to a voltage source in response to the activation signal; and a current mirror coupled to the switching PET means for producing a current corresponding to the connection and disconnection of the exclusive OR.

BRIEF DESCRIPTION OF THE DRAWINGS

The present invention will become more fully understood from the detailed description given below and the accompanying diagrams wherein:

FIG. 11b is a timing chart of a 1-bit comparator according to the first modification shown in FIG. 11a;

DESCRIPTION OF THE PREFERRED EMBODIMENTS

Figure 1:
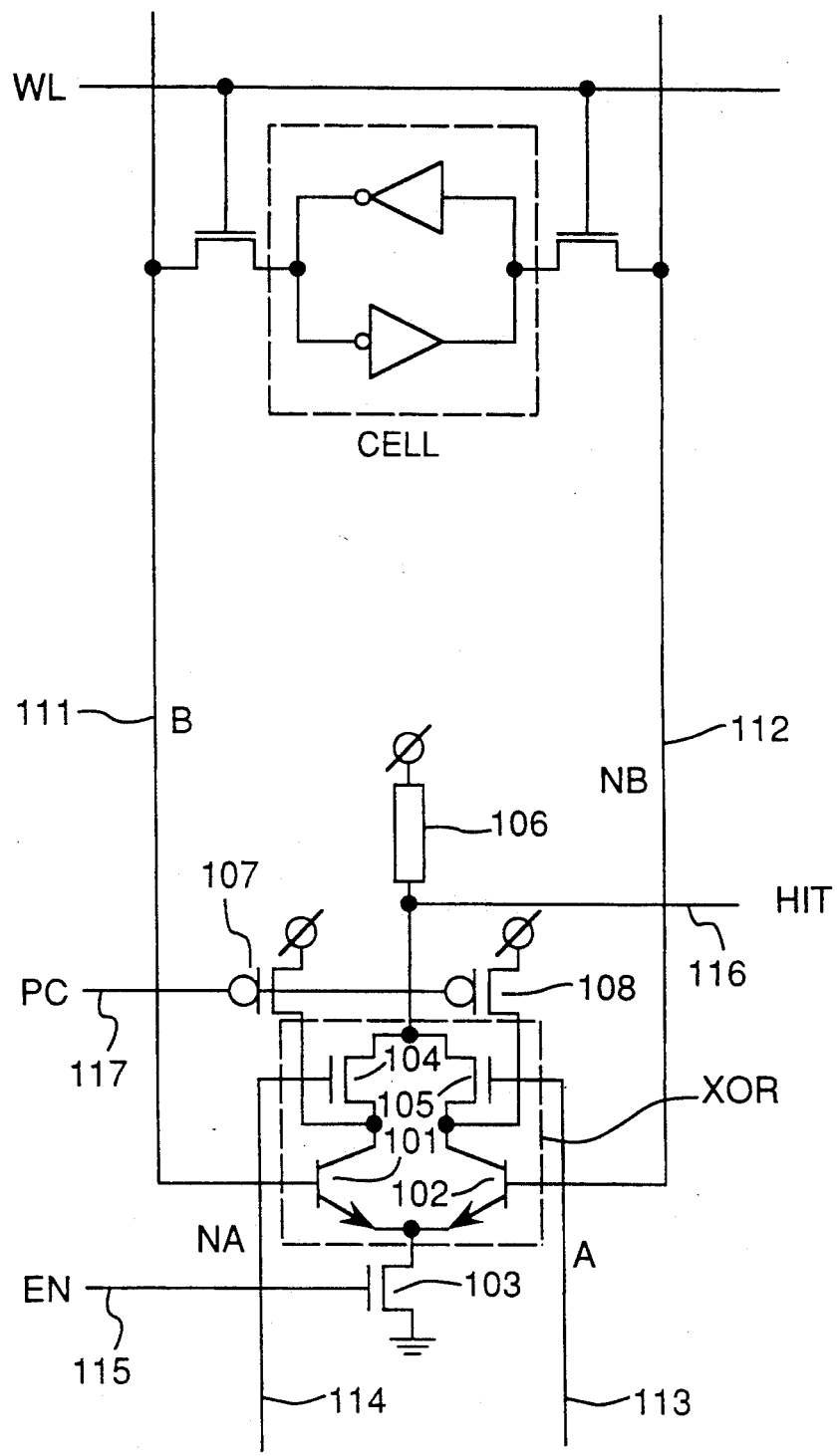
FIG. 1 is a circuit diagram of a 1-bit comparator according to the first embodiment of the invention.

The preferred embodiments of a comparator according to the present invention are described below with reference to the accompanying figures, of which FIG. 1 is a circuit diagram of a 1-bit comparator used in the cache memory comparators according to the first embodiment of the invention. This comparator compares one bit signal, e.g. NB 112, in the address read from the tag memory with one bit signal, e.g., NA 114, in the address from the CPU. It is noted that "N" in NA and NB represents logic "NOT".

Referring to FIG. 1, a differential sense amplifier is formed by two NPN transistors 101, 102 of which a bit line pair B 111 and NB 112 are the base inputs, respectively. A current switching N-channel MOSFET 103 is ON only when the sense enable signal EN 115 is HIGH, and operates as a constant current supply. Two other N-channel MOSFETs 104 and 105 control the collector current of the NPN transistors 101 and 102, respectively. The gate inputs to these MOSFETs 105 and 104 are respectively the address input line A 113 and the inverted address input line NA 114, which is the logic inversion signal of the address input line A 113. Transistors 101 and 102 and MOSFETs 104 and 105 form an XOR gate.

Other components of this embodiment are the load resistor 106, HIT output line 116, and P-channel MOSFETs 107 and 108 for precharging the collector voltage of the NPN transistors 101 and 102 when the precharge enable PC 117 signal is LOW.

It is to be noted that the precharge enable PC 117 signal and the sense enable signal EN 115 are the same phase, and a common signal can be used.

The operation of the 1-bit comparator shown in FIG. 1 is to detect signal coincidence between line A 113 and line B 111 (or between line NA 114 and line NB 112).

When both lines A 113 and B 111 carry a LOW level signal, lines NA 114 and NB 112 will eventually carry a HIGH level signal. In this came, transistor 101 closes and MOSFET 104 opens and, at the same time, transistor 102 opens and MOSFET 105 closes. Thus, there will be no current path established between resistor 106 and MOSFET 103. Thus, the voltage level of the output HIT 116 is HIGH, indicating that a coincidence of the signal between line A 113 and line B 111 (or between line NA 114 and line NB 112) is obtained.

However, when lines NA 114 and NB 112 carry different level signals, it is so detected that a non-coincidence is obtained. For example, when line A 113 carries HIGH and B 111 carries LOW, line NA 114 will carry LOW and line NB 112 will carry HIGH. In this case, transistor 101 closes and MOSFET 104 closes and, at the same time, transistor 102 opens and MOSFET 105 opens. Thus, there will be a current path established between resistor 106 and MOSFET 103 through MOSFET 105 and transistor 102. Thus, the voltage level of the output HIT 116 is grounded through the established current path and MOSFET 103. Thus, output HIT 116 produces a LOW level signal indicating that a non-coincidence of the signal between line A 113 and line B 111 (or between line NA 114 and line NS 112) is obtained.

Figure 2:
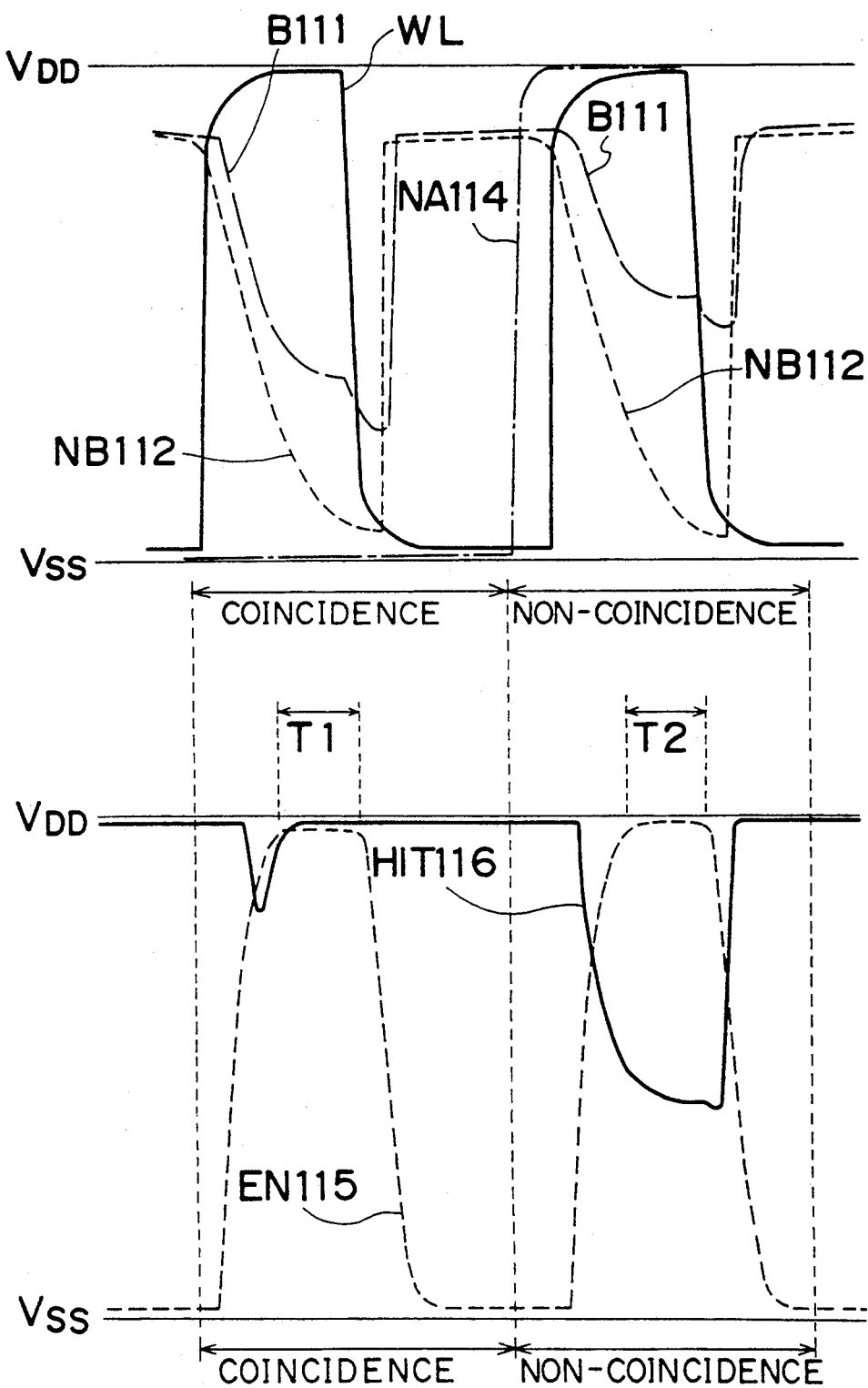
FIG. 2 is a timing chart of a 1-bit comparator according to the first embodiment of the invention.

When a coincidence is obtained, the output HIT 116 produces a HIGH level signal, but when a non-coincidence is obtained, the output HIT 116 is grounded to produce a LOW level signal. The operation for detecting the coincidence and non-coincidence is further described below with reference to the timing chart shown in FIG. 2, it is to be noted that the voltage waveforms shown in FIG. 2 correspond to the signals carried by the signal lines of the same reference numbers in FIG. 1.

(1) Coincidence

When a HIGH level signal ($V_{DD}$) is output to address input line A 113, a LOW level signal ($V_{SS}$) is output to the address inversion signal input line NA 114. When the word line WL is HIGH, HIGH and LOW level signals are output to the bit lines B 111 and NB 112, respectively. The comparator starts operating when the sense enable signal EN 115 becomes HIGH, that is during a period T1. Before the period T1, a transient current caused by parasitic capacity discharge is produced, and thus the voltage of the HIT output line 116 drops slightly. Also, before the period T1, by the precharge signal PC 117 having a similar waveform to that of the sense enable signal EN 115, MOSFETs 107 and 108 provides a predetermined voltage to each junctions of between transistors 101 and 104 and between transistor 102 and 105, so that the transistors 101 and 104 on one side of the XOR gate balances with the transistors 102 and 105 on the other side thereof. During period T1, there is no current from the collector of the NPN transistor 101 to which the base input is the HIGH bit line B 111 because the N-channel MOSFET 104 is OFF. Thus, during the period T1, since both signals NA 114 and NB 112 are LOW level signal, the voltage of the output line HIT 116 is maintained HIGH because there is no establishment of a current path.

(2) Non-coincidence

When a LOW level signal is output to address input line A 113, a HIGH level signal is applied to the address inversion signal input line NA 114. Then, when the word line WL becomes HIGH, HIGH and LOW level signals are applied to the bit lines B 111 and NB 112, respectively. Because the N-channel MOSFET 104 is ON at this time, there is a current path from the collector to the NPN transistor 101 to which the base input is the HIGH bit line B 111. As a result, a constant current flows to the load resistance 106. Thus, the voltage of the HIT output line 116 becomes Low. It is to be noted that the output LOW voltage is a voltage divided by the resistance component of the MOSFET and NPN transistor. If an inverter circuit or similar device having a logic threshold shifted lower than one-half the power supply voltage is used, there will be sufficient LOW output signal from the circuit.

Discharge of the parasitic capacity causes the collector voltage to drop in the NPN transistor for which the current path from the collector has been opened. Because equality of the collector voltage and base voltage of two NPN transistors is a prerequisite condition of comparison, operation during the next cycle will not be correct without any balancing operation. P-channel MOSFETs 107 and 108 are therefore provided as precharge circuits for precharging the collector voltage to HIGH during the sense amplifier standby state.

Figure 3C:
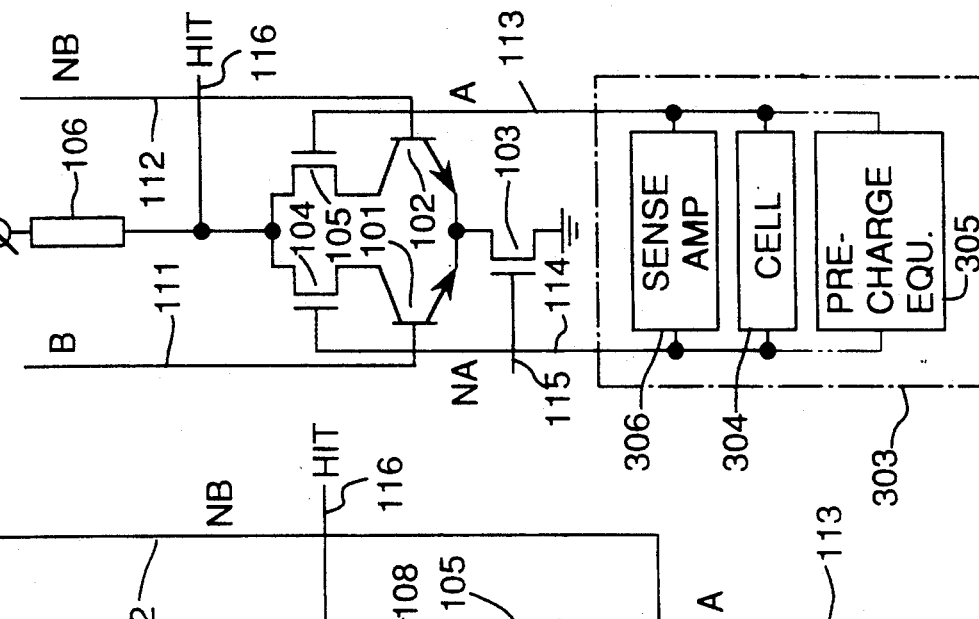
FIGS. 3a, 3b and 3c are each a circuit diagram of a 1-bit comparator according to a modification of the first embodiment of the invention.
Figure 3B:
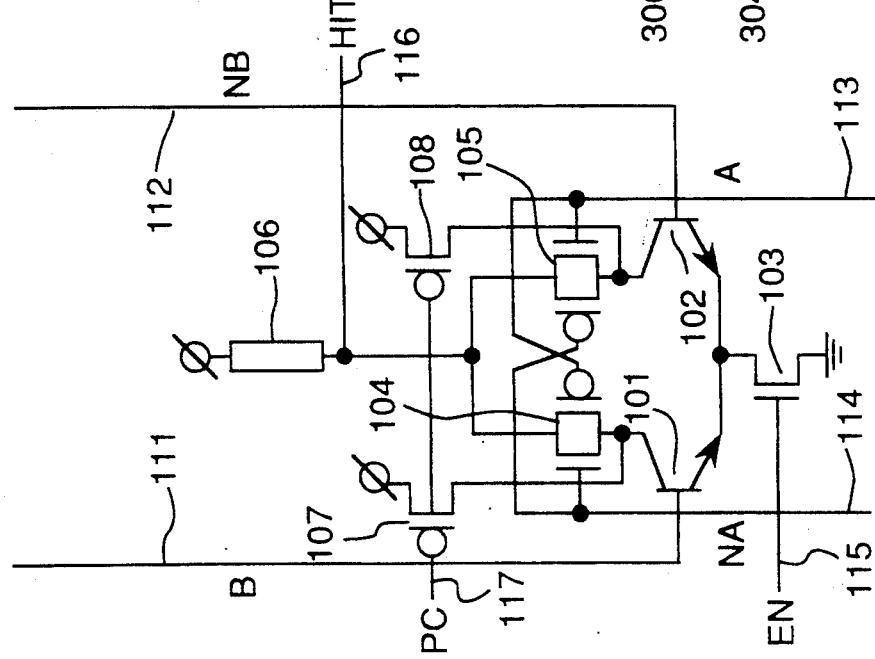
Figure 3A:
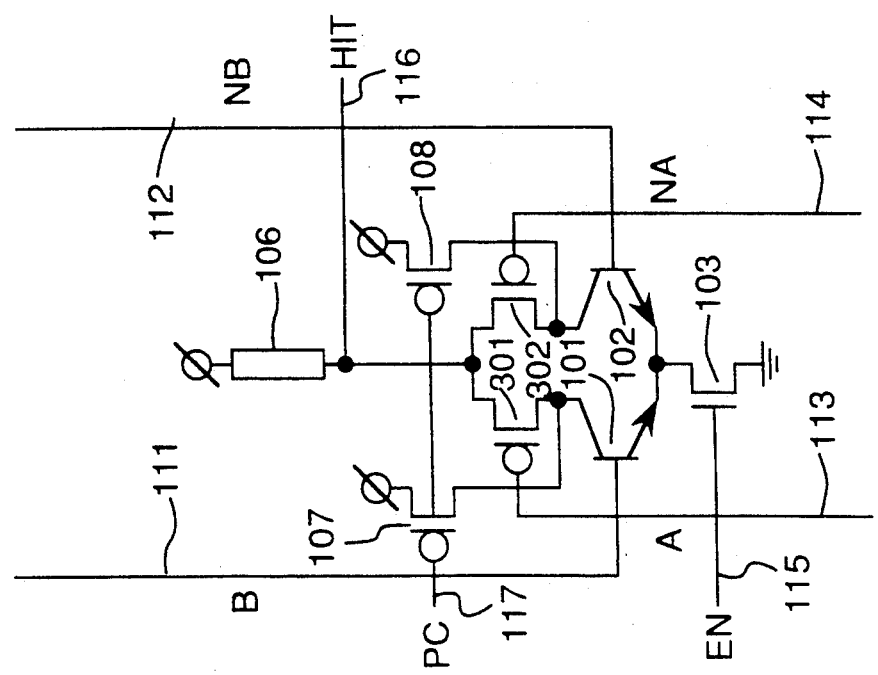

FIGS. 3a–3c show modifications of the comparator shown in FIG. 1. FIG. 3a is a circuit in which the P-channel MOSFETs 301 and 302 are provided in place of N-channel MOSFETs 104 and 105 for forming the collector current control circuit. FIG. 3b is a circuit in which both the N-channel MOSFETs 104 and 105 and P-channel MOSFETs 301 and 302 are used for forming a collector current control circuit. Note that like parts are indicated by like reference numbers in FIGS. 1 and 3.

With these circuits current flows to the collector of the NPN transistor 101 when the address input line A 113 is LOW, i.e., when the address inversion signal input line NA 114 is HIGH, and the collector current of the other NPN transistor 102 flows when the address input line A 113 is HIGH; thus resulting in the same operation as the construction shown in FIG. 1. It should also be noted that this construction also helps reduce the cell area because the P-channel MOSFETs 301, 302 can be formed in the N-type impurity area of the collector.

In the device shown in FIG. 3c, the address signal is read from the memory cell 304 of the memory circuit 303. In this case the precharge circuit is shared by the N-channel MOSFETs 104, 105. This is because the address input lines A 113 and NA 114 are precharged by the precharge/equalization circuit 305 during when the comparator and memory circuit are not accessed, resulting in such that the collector voltage of the NPN transistors 101, 102 is HIGH because the N-channel MOSFETs 104 and 105 are ON. It is to be noted that if the address input lines A 113 and NA 114 are HIGH during precharging, it is possible to connect the sense amplifier 306.

As described hereinabove, an exclusive NOR (XNOR) gate is formed by the differential sense amplifier 101 and 102 and collector current control MOSFETs 104 and 105 (and/or 301 and 302) in the present embodiment of the invention. The sense amplifier and comparator are thus affectively combined or integrated formed, and reading and comparison are performed simultaneously to shorten the required read/comparison time.

SECOND EMBODIMENT

Figure 4:
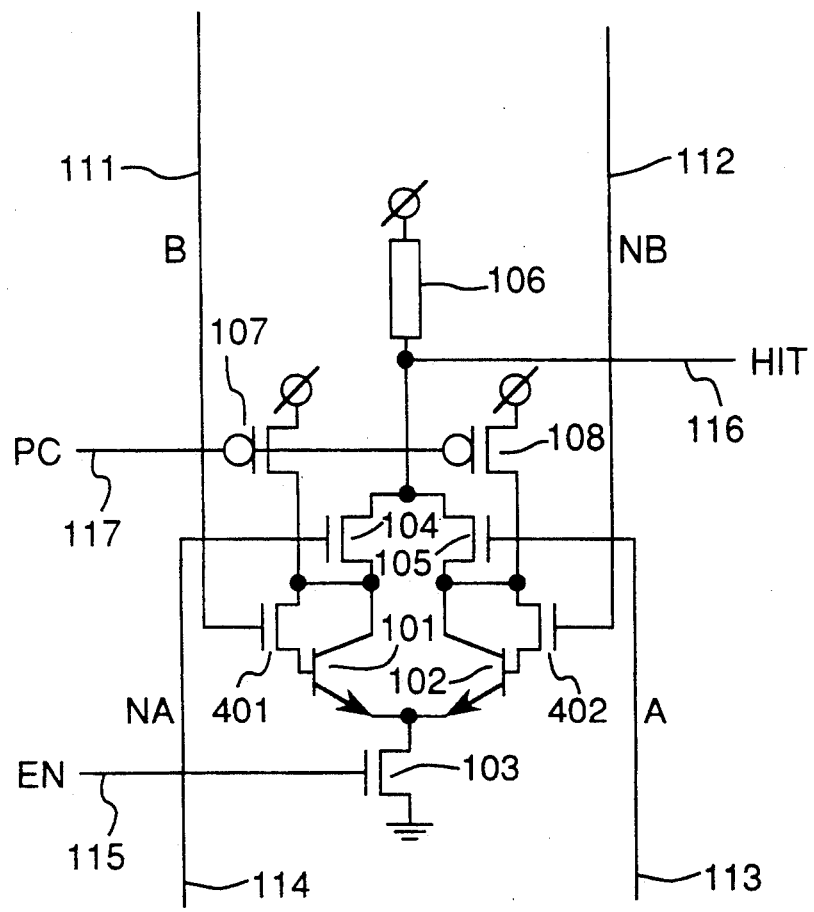
FIG. 4 is a circuit diagram of a circuit diagram of a 1-bit comparator according to the second embodiment of the invention.

FIG. 4 is a circuit diagram of a 1-bit comparator used in the cache memory comparators according to the second embodiment of the invention. This comparator compares one bit in the address read from the tag memory with one bit in the address from the CPU.

This embodiment of the invention increases the input impedance of the differential circuit by providing a MOSFET of which the gate inputs are the bit line pair, and the source and drain are connected to the base and collector of an NPN transistor. Note that like parts are indicated by like reference numbers in FIGS. 1 and 4.

The second embodiment of FIG. 4 differs from the first embodiment in that the N-channel MOSFETs 401, 402 are further provided. The N-channel MOSFETs 401, 402 have their gate inputs connected to the bit line pair B 111, NB 112, and the drain and source thereof connected to the collector and base of the differential sense amplifier, respectively. Other is than the point that the base current is supplied to the NPN transistor, the configuration of the second embodiment is identical to that of the first embodiment shown in FIG. 1.

Figure 5:
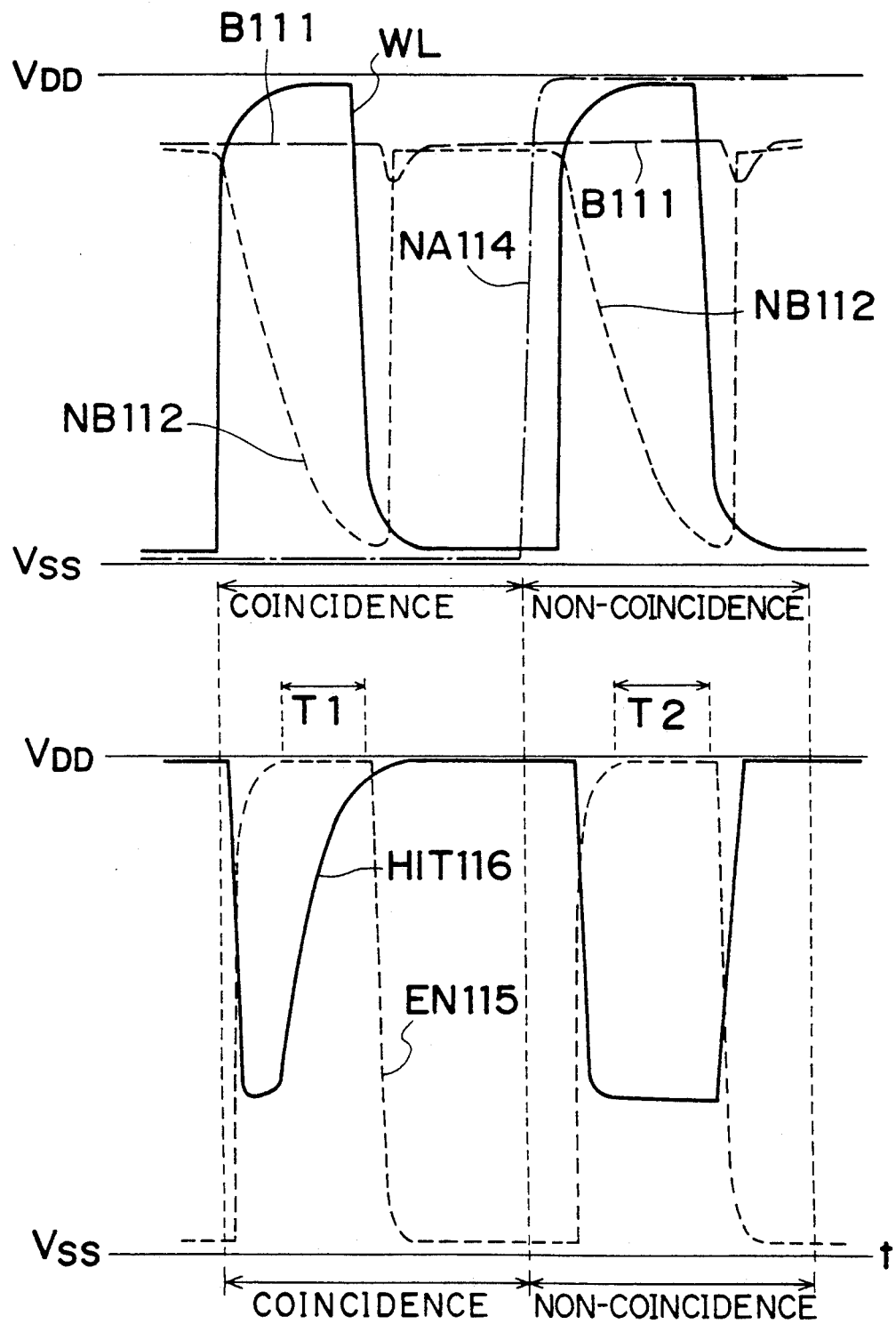
FIG. 5 is a time chart of a 1-bit comparator according to the second embodiment of the invention.

The voltage waveforms of each signal line in the 1-bit comparator are shown in FIG. 5. Except for an initial transient voltage drop, the HIT output line 116 is HIGH when the input signal is coincident, and LOW when not coincident as with the waveforms of the first embodiment shown in FIG. 2. Unlike in the first embodiment, the input impedance of the differential sense amplifier 101, 102 is high, and the HIGH bit line voltage does not drop because the NPN transistor base current is supplied through the MOSFET (FIG. 5). As a result, there is virtually no danger of memory circuit operating errors resulting from the noise signal.

Figure 6:
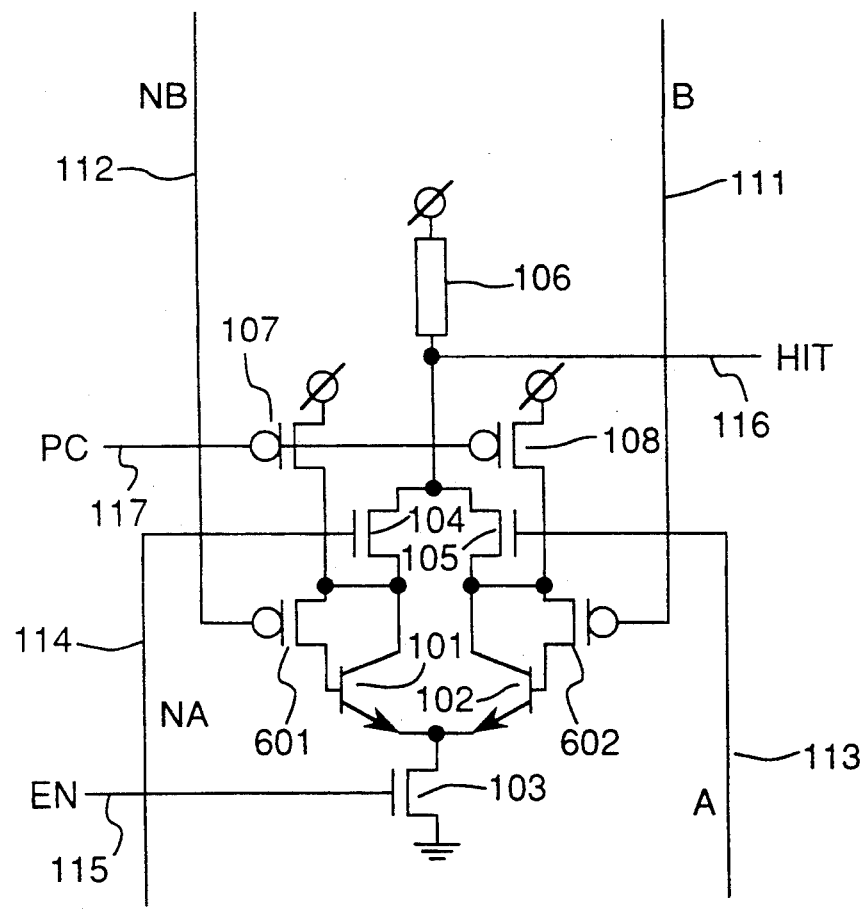
FIG. 6 is a circuit diagram of a 1-bit comparator according to a modification of the second embodiment of the invention.

FIG. 6 is a modification of the second embodiment in which P-channel MOSFETs 601, 602 are used in place of N-channel MOSFETs 401 and 402 to form the collector base current supply MOSFET. In this case too, a strong base current is supplied to the NPN transistor 101 when the memory data is HIGH, i.e., the inverted bit line NB 112 is LOW, as with the 101, 1-bit comparator shown in FIG. 4. This device therefore functions in the same way as the 1-bit comparator shown in FIG. 4.

Furthermore, it should also be noted that this construction also helps reduce the cell area because the P-channel MOSFETs 601, 602 can be formed in the N-type impurity area of the collector.

It is to be noted that even if the memory cell contents are output to the bit line, the comparator will not act effectively unless the bit line-source voltage of the P-channel MOSFETs 601, 602 exceeds the threshold voltage Vt, that is unless the MOSFET operating condition $Vgs \geq Vt$ (where Vg is the bit line voltage and Vs is the source voltage) is satisfied. As a result, this non-operating time increases if the bit line is precharged to $V_{DD}$. To achieve a high speed comparison mode, it is sufficient to lower the precharge voltage to $V_{DD}-Vt$ or less.

As described hereinabove, an exclusive NOR (XNOR) gate is formed by the differential sense amplifier and collector current control MOSFET in the present embodiment of the invention. The sense amplifier and comparator are thus effectively integrated, and the read/comparison operations can be completed in a short time. In addition, the base current of the NPN transistor is supplied through the MOSFET of which the gate inputs are the bit lines. Stable operation of the memory circuit can be achieved with a small hardware configuration because the MOS circuit changes the impedance without using an emitter follower circuit. Furthermore, saturation of the NPN transistors can be prevented because the NPN transistor collector-base is clamped by the MOSFET threshold voltage Vt.

Finally, this embodiment is described with the base current supply MOSFET added to the comparator shown in FIG. 1, but the same effect can be obtained by adding this MOSFET to the comparator shown in FIG. 3.

THIRD EMBODIMENT

Figure 7:
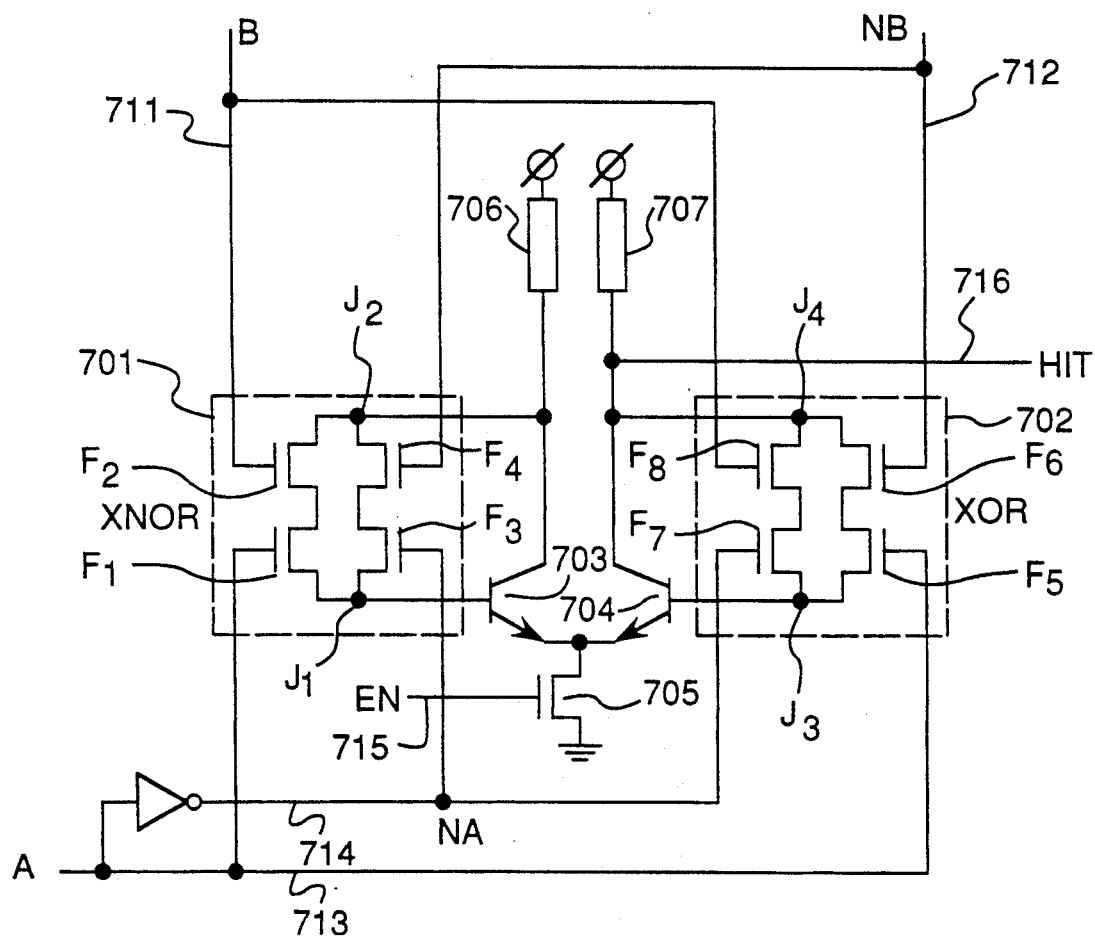
FIG. 7 is a circuit diagram of a 1-bit comparator according to the third embodiment of the invention.

Referring to FIG. 7, a third embodiment of a comparator according to the present invention is shown wherein a 1-bit comparator is used in the cache memory comparators for comparing one bit in the address read from the tag memory with one bit in the address from the CPU.

Referring to FIG. 7, an XNOR gate 701 is formed by four N-channel MOSFETs F1, F2, F3 and F4. Gates of MOSFETs F1 and F2 are connected to address line A 713 and bit line 13 711, respectively, and gates of MOSFETs F3 and F4 are connected to inverted address line NA 714 and inverted bit line NB 712, respectively. MOSFETs F1 and F2 are connected in series and MOSFETs F3 and F4 are connected in series. The sources of MOSFETs F1 and F3 are connected to a junction J1 and further to the base of transistor 703. The drains of MOSFETs F2 and F4 are connected to a junction J2 and further to the collector of transistor 703.

Similarly, an XOR gate 702 is formed by four N-channel MOSFETs F5, F6, F7 and F8. Gates of MOSFETs F5 and F6 are connected to address line A 713 and inverted bit line NB 712, respectively, and gates of MOSFETs F7 and F8 are connected to inverted address line NA 714 and bit line B 711, respectively. MOSFETs F5 and F6 are connected in series and MOSFETs F7 and F8 are connected in series. The sources of MOSFETs F5 and F7 are connected to a junction J3 and further to the base of transistor 704. The drains of MOSFETs F6 and F8 are connected to a junction J4 and further to the collector of transistor 704.

The NPN transistors 703, 704 forms a differential sense amplifier.

The current-switching N-channel MOSFET 705 is ON only when the sense enable signal EN 715 is HIGH. When the current-switching N-channel MOSFET 705 is ON, it functions as the constant current supply to the differential sense amplifier. Load resistors 706, 707 are provided for the differential sense amplifiers, and the result is output to the HIT output line 716.

Figure 8:
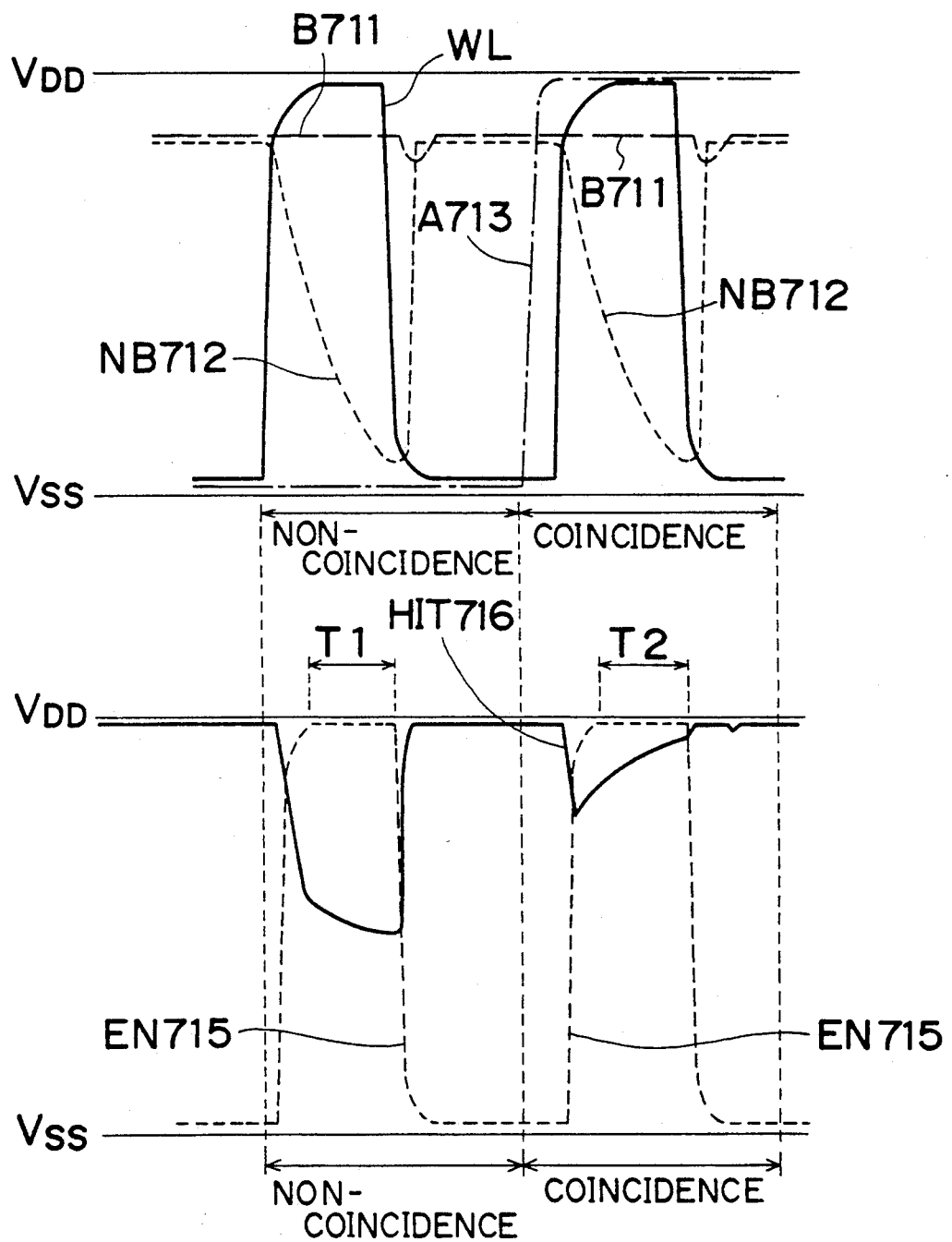
FIG. 8 is a timing chart of a 1-bit comparator according to the third embodiment of the invention.

The operation of the 1-bit comparator shown in FIG. 7 is described below with reference to the timing chart shown in FIG. 8. It is to be noted that the voltage waveforms shown in FIG. 8 correspond to the signals carried by the signal lines of the same reference numbers in FIG. 7.

(1) Non-coincidence

When a LOW level signal is applied to address input line A 713, a HIGH level signal is applied to the inverted address input line NA 714. Then, when the word line WL becomes HIGH, HIGH and LOW level signals are applied to the bit lines B 711 and NB 712, respectively. The XNOR gate 701 and XOR gate 702, both formed by pass transistor logic circuits, become OFF and ON, respectively, and the base current is supplied to the NPN transistor 704.

When the sense enable signal EN 715 becomes HIGH, the differential sense amplifier starts operating, and the collector current of the NPN transistor 704 flows. A voltage drop in the load resistor 707 occurs, and the output line 716 becomes LOW. It is to be noted that the output LOW voltage is a voltage divided by the resistance component of the MOSFET and NPN transistor. If an inverter circuit or similar device having a logic threshold shifted lower than one-half the power supply voltage is used, there will be sufficient LOW output signal from the circuit.

(2) Coincidence

When a HIGH level signal is applied to address input line A 713, a LOW level signal is applied to the inverted address input line NA 714. Then, when the word line WL becomes HIGH, HIGH and LOW level signals are applied to the bit lines B 711 and NB 712, respectively. The XNOR gate 701 and XOR gate 702, both formed by pass transistor logic circuits, become ON and OFF, respectively. The differential sense amplifier starts operating when the sense enable signal EN 715 becomes HIGH, a transient current caused by parasitic capacity discharge is emitted, and the voltage of the HIT output line 716 drops slightly. However, the base current is not supplied to the NPN transistor 704 and there is no constant collector current path because the XOR gate 702 is OFF. When the initial discharge is completed, the HIT output line 716 voltage does not drop any further, and is raised to the power supply voltage $V_{DD}$ by the load register 707 again.

As described hereinabove, the present embodiment of the invention forms XOR and XNOR gates from pass transistor logic circuits, which are then combined with differential sense amplifiers to form a comparator. By thus effectively integrating a sense amplifier and comparator, reading and comparison operations can be simultaneously performed, and the read/comparison time can be shortened.

Furthermore, because the NPN transistor base current is supplied through the MOSFET devices, the input impedance of the differential sense amplifier increases. Thus, there is no drop in the HIGH bit line voltage, and there is no danger of the memory circuit storing false data because of noise signal.

In addition, the base voltage of the NPN transistors 703, 704 is clamped at a voltage leas than the collector voltage by the voltage of the serial MOSFET devices in the pass transistor logic circuit, and an NPN transistor saturation prevention circuit can be achieved using small MOSFET devices, eliminating the need for emitter follower circuits requiring a large area.

The present embodiment of the invention can therefore achieve a high speed comparator in a small hardware package for use in translation look-aside buffers and tag memory devices of cache memories requiring simultaneous reading of plural bits.

FOURTH EMBODIMENT

Figure 9:
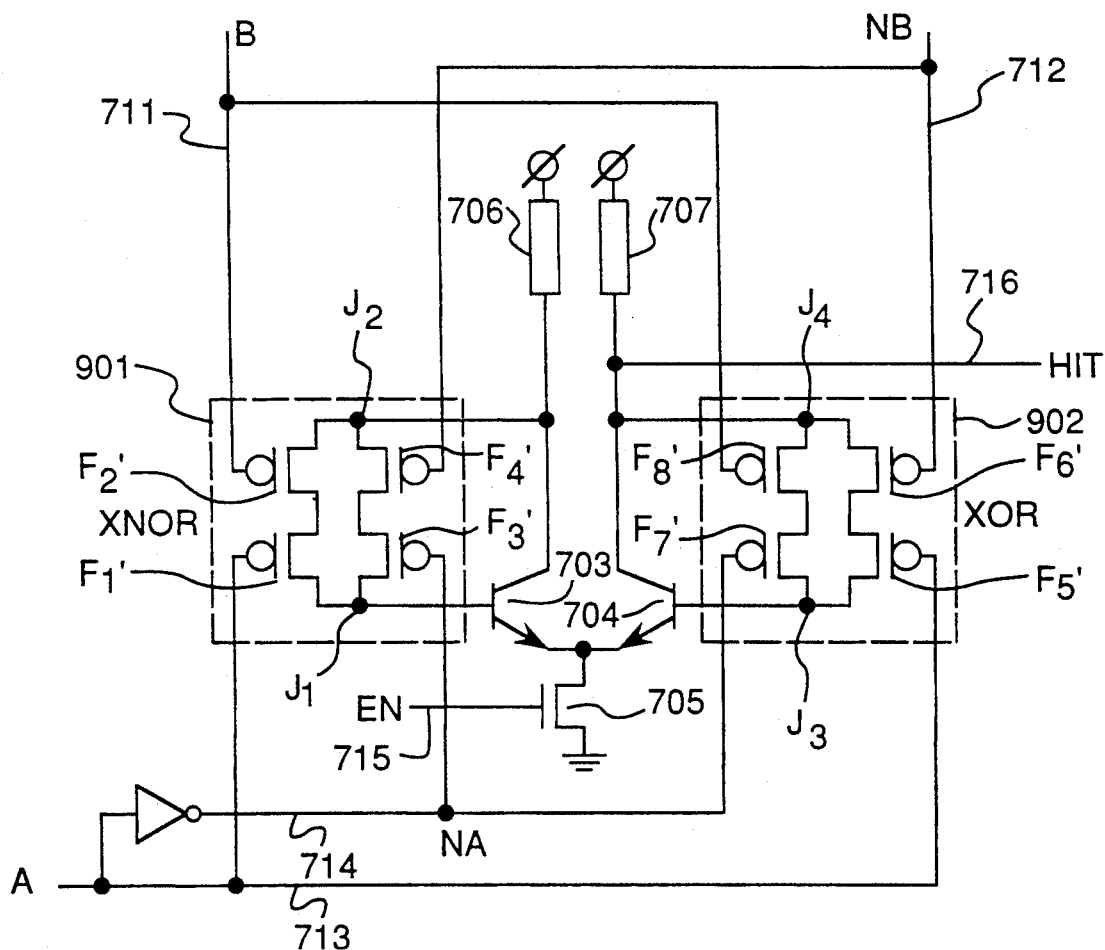
FIG. 9 is a circuit diagram of a 1-bit comparator according to the fourth embodiment of the invention.

FIG. 9 is a circuit diagram of a 1-bit comparator used in the cache memory comparators according to the fourth embodiment of the invention. This comparator compares one bit in the address read from the tag memory with one bit in the address from the CPU.

In this embodiment, the P-channel MOSFETs F1', F2', F3', F4', F5', F6', F7' and F8' are used to form the XNOR gate 901 and XOR gate 902 of the pass transistor logic circuit. As with the 1-bit comparator shown in FIG. 7, the base current is not supplied to the NPN transistor 704 when the voltages of the bit line pair B 711, NB 712 and address input line pair A 713, NA 714 are coincident, and the base current is supplied when the voltages are non-coincident. As a result, this comparator operates identically to the 1-bit comparator shown in FIG. 7.

Furthermore, it should also be noted that this is construction also helps reduce the call area, because the P-channel MOSFETs can be formed in the N-type impurity area of the collector, and thus an element separation area between the NPN transistor and P-channel MOSFET is not needed.

It is to be noted that even if the memory call contents are output to the bit line, the operating conditions of the P-channel MOSFET devices of which the gate input is the bit line pair will not be satisfied and the comparator will not function unless the bit line-collector voltage exceeds the threshold voltage Vt of the P-channel MOSFET, that is unless the MOSFET operating condition $V_{bc} = V_{gs} \geq V_t$ (where Vb is the voltage of one of the bit lines, VC is the collector voltage, and Vgs is the gain-source voltage of the P-channel MOSFET) is satisfied. As a result, this non-operating time increases if the bit line is precharged to $V_{DD}$, but a high speed comparison mode can be achieved by lowering the precharge voltage to $V_{DD} - V_t$ or less.

As described hereinabove, an XOR gate and XNOR gate are formed by the pass transistor logic circuit, and the comparator is formed by combining these with a differential sense amplifier. The sense amplifier and comparator are thus effectively integrated, and the read/comparison time can be shortened by performing both operations simultaneously. In addition, because the base current of the NPN transistor is supplied through the MOSFET devices, the input impedance of is the differential sense amplifier rises, there is no danger of the memory circuit storing false data, and a bipolar transistor saturation prevention circuit can be formed using small MOSFET devices.

The present embodiment of the invention can therefore achieve a high speed comparator in a small hardware package for use in translation look-aside buffers and tag memory devices of cache memories requiring simultaneous reading of plural bits.

FIFTH EMBODIMENT

Figure 10A:
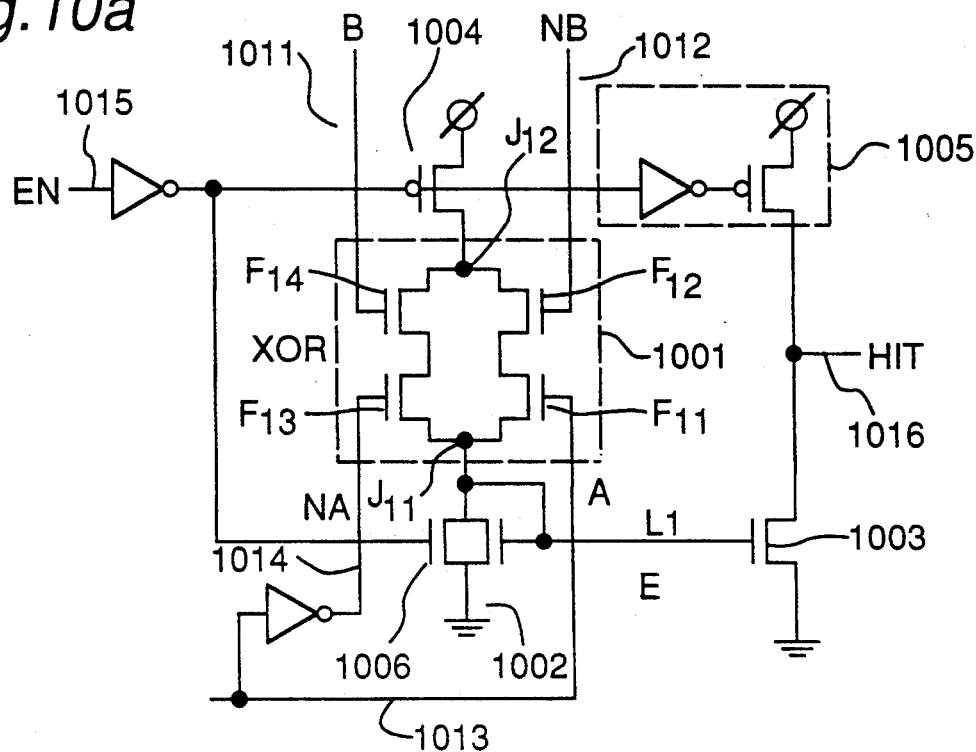
FIG. 10a is a circuit diagram of a 1-bit comparator according to the fifth embodiment of the invention.

FIG. 10a is a circuit diagram of a 1-bit comparator used in the cache memory comparators according to the fifth embodiment of the invention. This comparator compares one bit in the address read from the tag memory with one bit in the address from the CPU.

In this embodiment, an XOR gate 1001 is formed by first, second, third, and fourth N-channel MOSFETs F11, F12, F13 and F14 which have their gates connected to lines A 1013, NB 1012, NA 1014 and B 1011, respectively. A junction J11 between sources of MOSFETs F11 and F13 is connected to ground through a switching MOSFET 1006, and a junction J12 between drains of MOSFETs F12 and F14 is connected to a voltage source through a switching MOSFET 1004. The first and second junctions J11 and J12 are connected when the signals on lines A 1013 and B 1011 are in the opposite state, and are disconnected when the signals on lines A 1013 and B 1011 are in the same state.

N-channel MOSFET devices 1002 and 1003 form a current mirror circuit which receives the discharge current from XOR gate 1001 as a reference input current. P-channel MOSFET 1004 is provided for the current switch which turns on when the sense enable signal EN 1015 becomes HIGH. A precharge circuit 1005 is provided for the HIT output line 1016. N-channel MOSFET 1006 is provided for turning off the current mirror circuit.

The operation of the fifth embodiment of FIG. 10a is as follows. When the comparator is in the stand-by state, the sense enable signal EN 1015 becomes LOW. Thus, at the initial state, the HIT output line 1016 is precharged to HIGH by the precharge circuit 1005, and at the same time, the current mirror circuit is turned off by the LOW level signal applied to line L1 connected to the gates of the N-channel MOSFET devices 1002 and 1003. When the voltages at the bit line pair B 1011 and NH 10121 and address input line pair A 1013 and AN 1014 reach the required level, the sense enable signal EN 1015 becomes HIGH. Then the voltages at the bit line pair are compared with the voltages at the address input line pair.

Figure 10B:
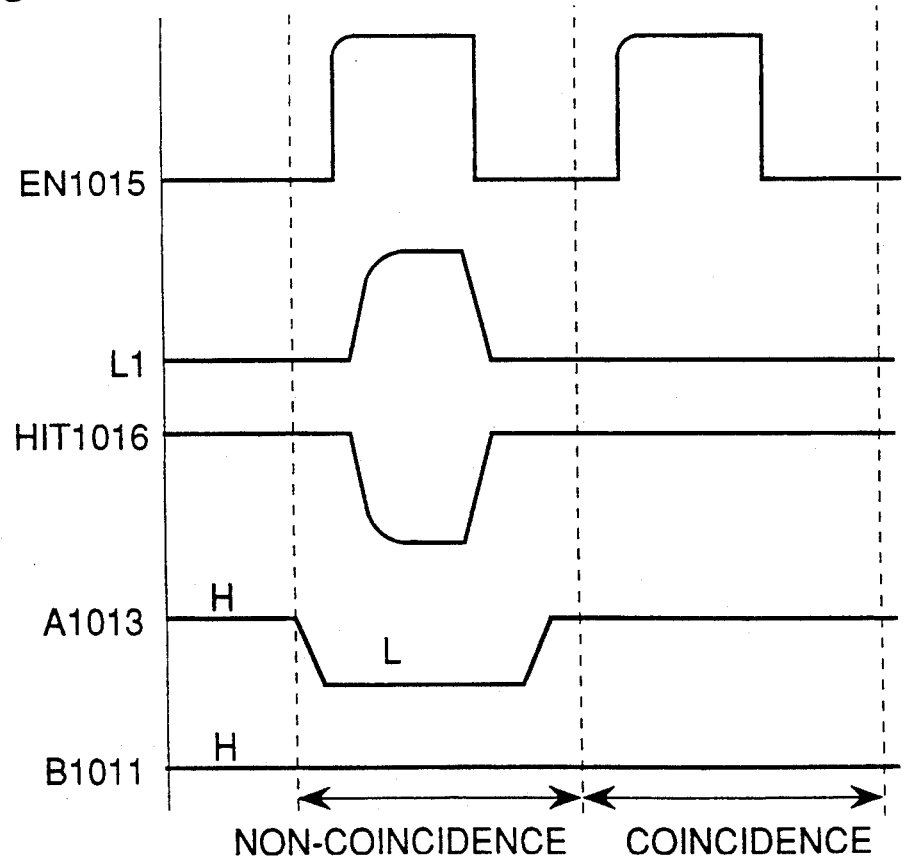
FIG. 10b is a timing chart of a 1-bit comparator according to the fifth embodiment of the invention.

As shown in FIG. 10b, when the voltages are non-coincident, the XOR gate 1001 closes. Thus, discharge current from the XOR gate 1001 is supplied to the drain of N-channel MOSFET 1002, providing reference current to the current mirror circuit. Thus, a current flows through the drain of the N-channel MOSFET 1003. Since the drain of the N-channel MOSFET 1003, i.e., the output of the current mirror circuit is connected to the HIT output line 1016, the current flowing through the drain of the MOSFET 1003 causes the discharge of the HIT output line 1016, which then result in the LOW level.

On the other hand, when the voltages are coincident, the XOR gate 1001 closes to maintain the LOW level signal at the gates of MOSFETs 1002 and 1003. Thus, the HIT output line 1016 is maintained HIGH.

According to this embodiment, since the HIT output line 1016 can be discharged with only one MOSFET 1003, it is possible to speed up the detection of the non-coincident and coincident.

Figure 11A:
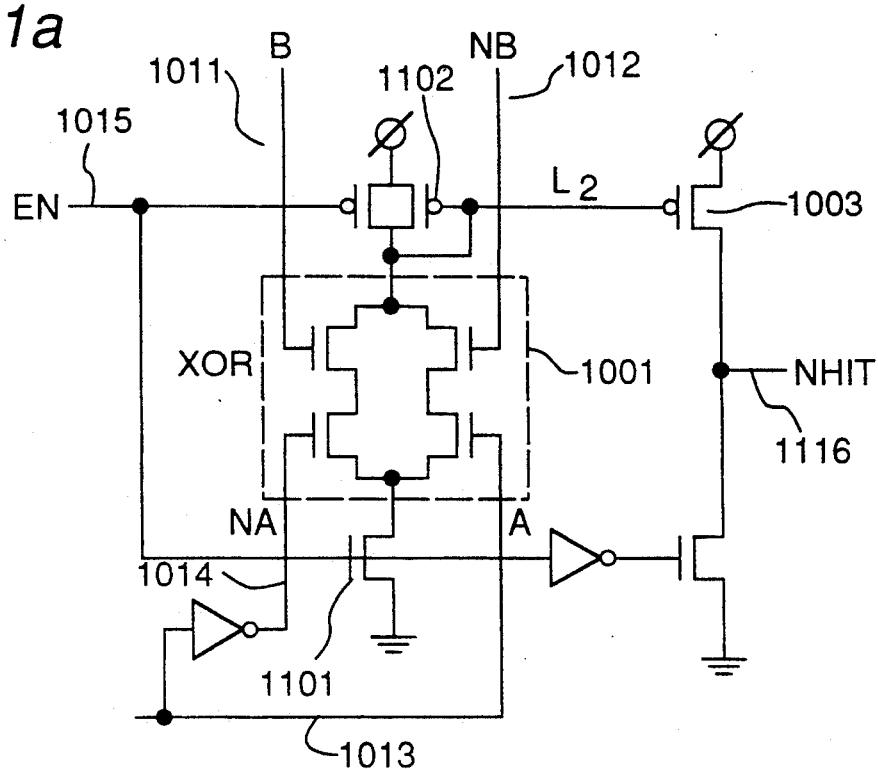
FIG. 11a is a circuit diagram of a 1-bit comparator according to a first modification of the fifth embodiment of the invention.
Figure 11B:
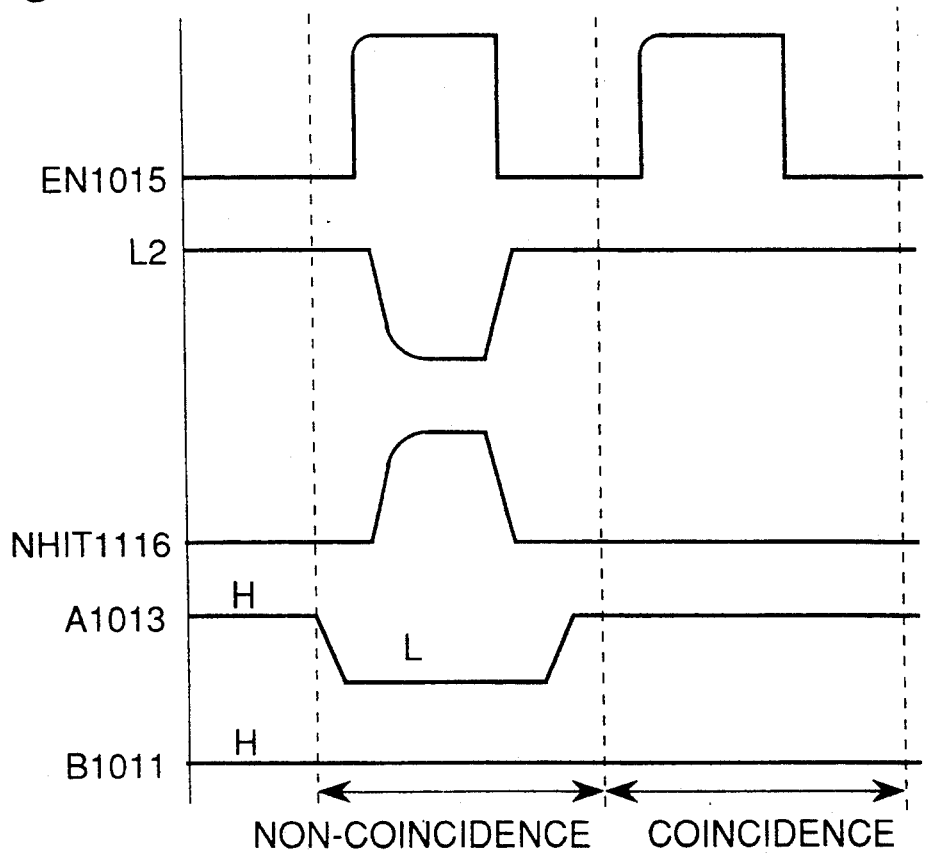

Referring to FIG. 11a, a first modification of the fifth embodiment is shown. According to the first modification, the P-channel MOSFET 1004 for the current switch is replaced with N-channel MOSFET 1101, and the current mirror circuit is formed by P-channel MOSFETs 1102 and 1103. The operation of the modification of FIG. 11a is shown in FIG. 11b.

Figure 11C:
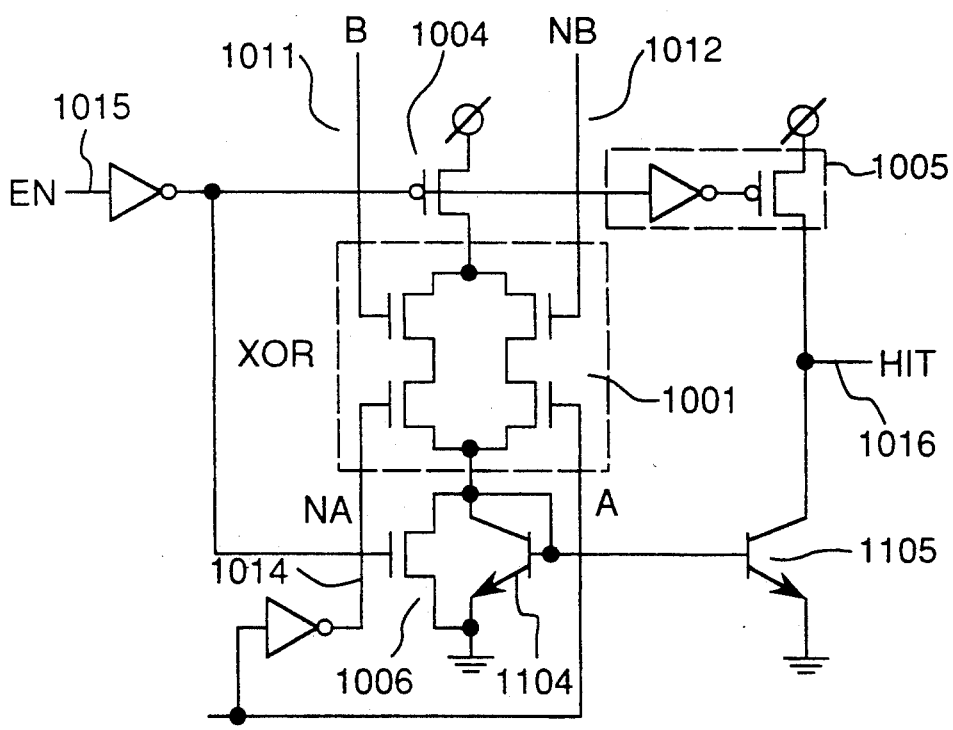
FIG. 11c is a circuit diagram of a 1-bit comparator according to a second modification of the fifth embodiment of the invention.

Referring to FIG. 11c, a second modification of the fifth embodiment is shown. According to the second modification, the current mirror circuit is formed by NPN transistors 1104 and 1105.

SIXTH EMBODIMENT

Figure 12:
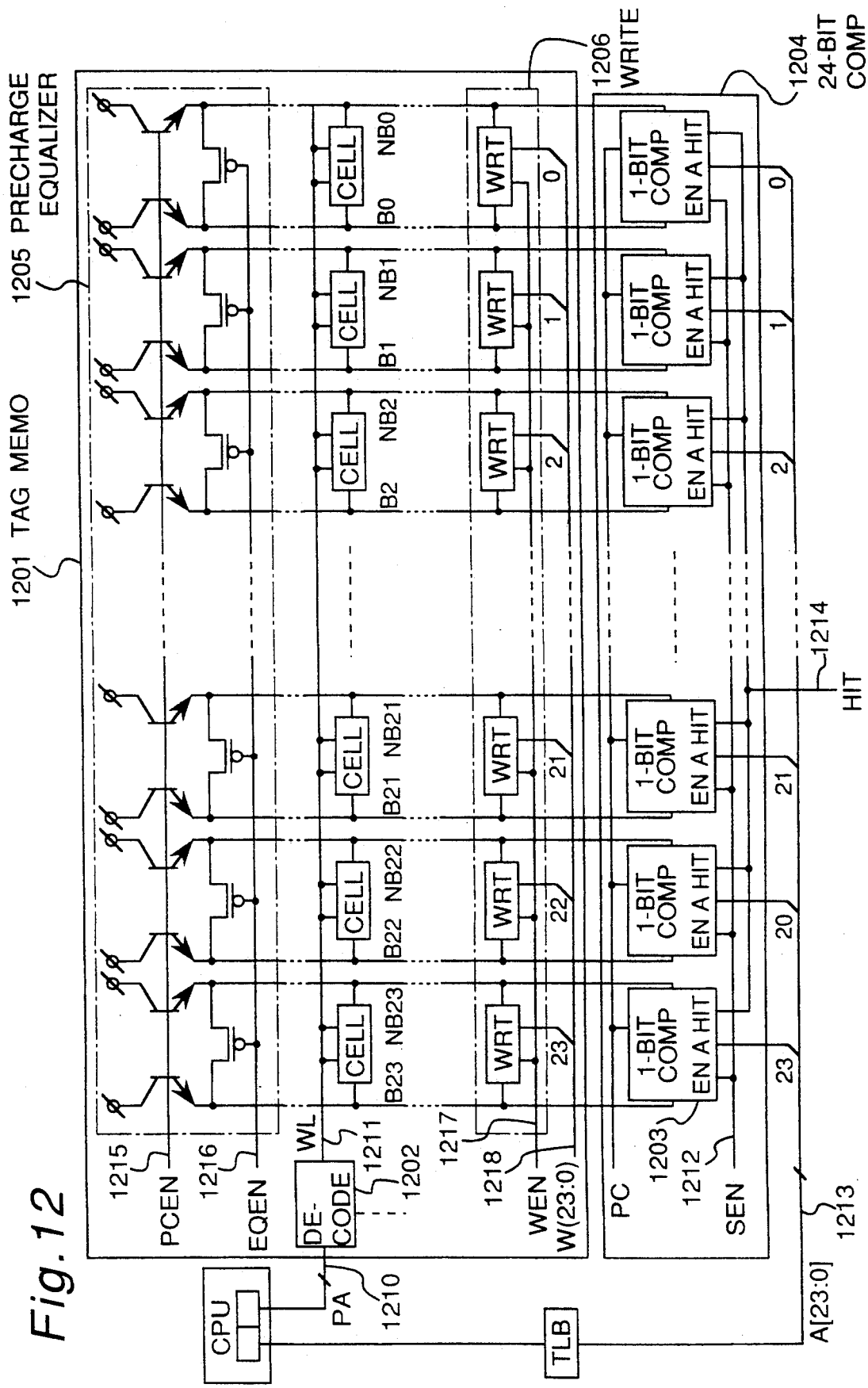
FIG. 12 is a circuit diagram of comparators and tag memory of a cache memory according to the sixth embodiment of the invention.

FIG. 12 is a circuit diagram of the tag memory area of a cache memory device according to a sixth embodiment of the invention. The output leads of twenty-four 1-bit comparators described in any of the first to fifth embodiment are connected in a wired OR configuration to form a 24-bit comparator. Thus, if any one or more of the HIT output line is grounded to produce a LOW level signal, all the remaining HIT output lines will also be grounded, resulting in a LOW level signal from HIT output 1214. Thus, HIT output 1214 produces a HIGH level signal only when all the HIT output lines from the twenty-four 1-bit comparators produce HIGH level signals. Thus, the OR gate for taking a logic OR of twenty-four HIT output lines can be easily formed without using any logic gates, such as AND logic 1405 shown in FIG. 14.

Referring to FIG. 12, the tag memory 1201 is accessed by the input address PA 1210, which is decoded by the decoder 1202. When the word line WL 1211 voltage is HIGH, the data stored in the memory cell array selected by the HIGH word line WL 1211 is output to the bit line pair thereof as address B [23:0]. When the sense enable line SEN 1212 becomes HIGH, each bit in address A [23:0] 1213 from the central processing unit (CPU) and B [23:01] is compared for coincidence/non-coincidence by the 1-bit comparators 1203.

Each of the 1-bit comparator 1203 is described in any of the first to fifth embodiments above, and is formed by combining or integrating a sense amplifier and coincidence/non-coincidence detection circuit. According to the 1-bit comparator of the first and second embodiments described above, a precharge signal is necessary, but it is possible to use the sense enable signal SEN 1212 as well. By connecting the output leads of each of the 1-bit comparators 1203 in a wired OR configuration, a 24-bit comparator 1204 is constructed. Wired OR Connection of the output leads is possible because each 1-bit comparator detects the voltage drop of the load resistor as the output voltage. The voltage of the output line HIT 1214 is LOW if a non-coincident result is obtained for any one bit, but is HIGH when all bits are coincident.

The precharge/equalization circuit 1205 precharges and equalizes the bit line pair during tag memory non-access periods as controlled by the precharge enable PCEN signal 1215 and the equalization enable signal EQEN 1216. An NPN transistor is used as the precharge circuit for high speed reading and bit line precharging and equalization. The write circuit 1206 for writing data W [23:0] 1218 is controlled by the write enable signal WEN 1217.

Figure 14:
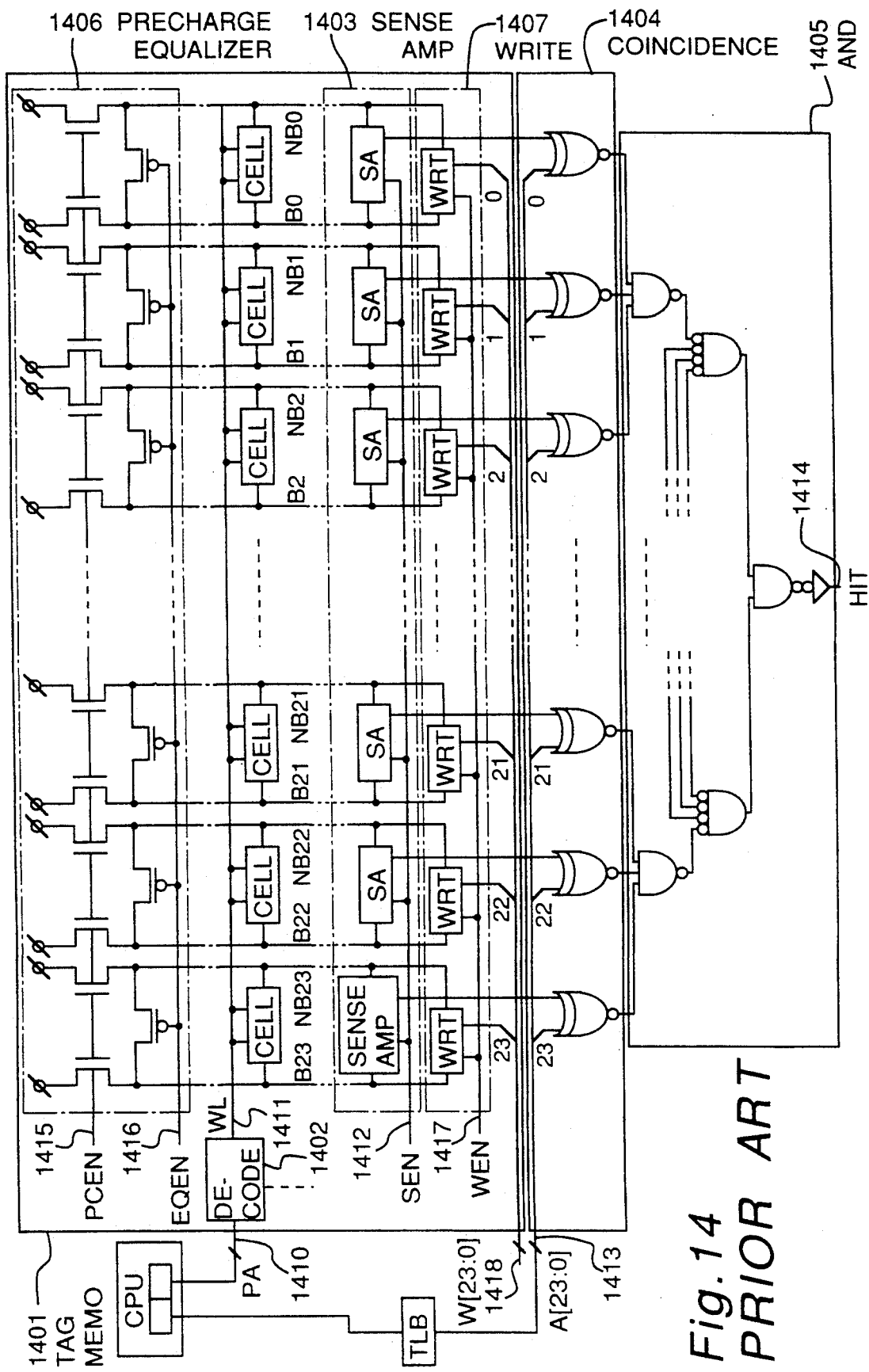
FIG. 14 is a circuit diagram of comparators and tag memory of a cache memory according to prior art.
Figure 15:
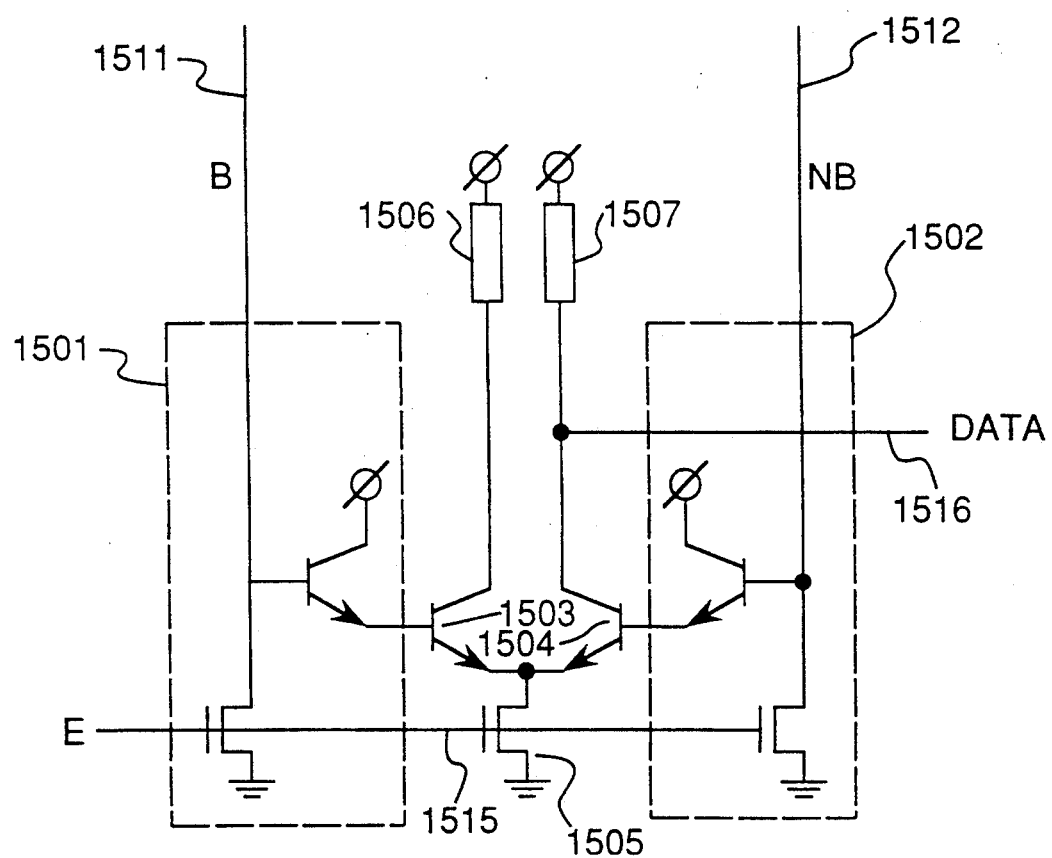
FIG. 15 is a circuit diagram of a sense amplifier according to prior art.

It is to be noted that the hardware configuration required to achieve this embodiment is smaller because the plural input AND Circuit, as required in the prior art device as shown in FIG. 14, for generating the logical product of the coincidence/noncoincidence result signals for each bit is not required. In addition, high speed coincidence/noncoincidence detection is possible because the delay time of the AND circuit is eliminated.

SEVENTH EMBODIMENT

Figure 13:
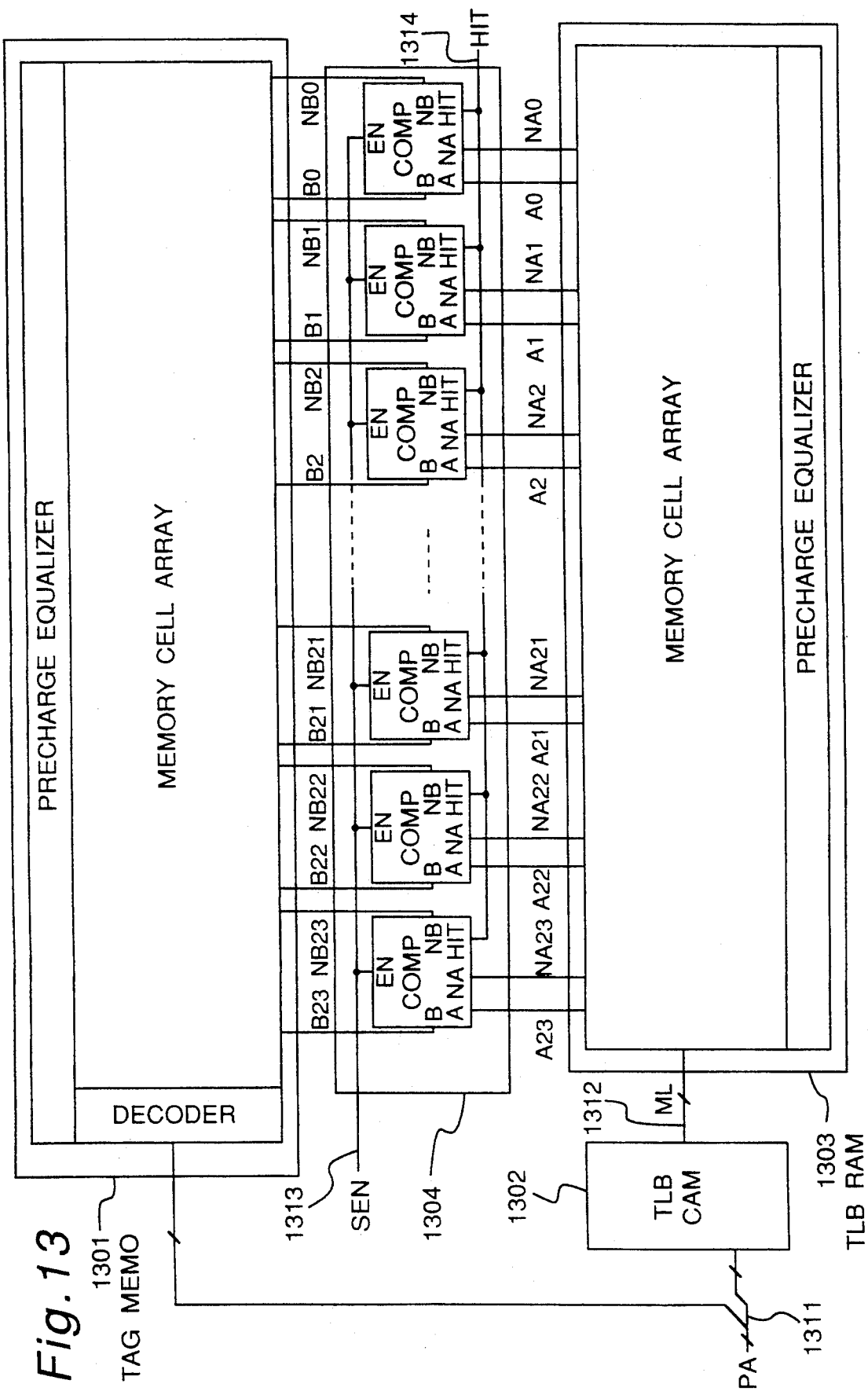
FIG. 13 is a circuit diagram of comparators and tag memory of a cache memory according to the seventh embodiment of the invention.

FIG. 13 is a circuit diagram of a physical address cache memory system according to the seventh embodiment of the present invention. In this embodiment the physical address PA read by the tag memory and the physical address converted by the translation look-aside buffer (TLB) are compared by the multiple bit comparator described in the sixth embodiment above.

Referring to FIG. 13, a given word is selected by the tag memory 1301 according to a specific number of bits in the logical address PA 1311 from the CPUP and physical address B [23:0] is output to the bit line pair from the memory cell array. When a stared data address in the CAM (content-addressable memory) area of the translation look-aside buffer content-addressable memory (TLB CAM) 1302 is matched by selected bits in the logical address PA 1311, one bit in the coincident signal line 1312 becomes HIGH, and the physical is address A [23:0] from the TLB RAM 1303 is output. The comparator 1304 described in the third embodiment above compares the two physical addresses A [23:0] and 3 [23:0] when the sense enable signal SEN 1313 is HIGH. If the two physical addresses are coincident, the output line HIT 1314 is HIGH; otherwise the output line HIT 1314 is LOW. It is to be noted that what bits in the logical address PA are used by the CAM and tag memory is dependent upon the set number and line size of the cache memory.

The hardware configuration required to achieve this embodiment can be made smaller because the plural input AND circuit for generating the logical product of the coincidence/noncoincidence result signals for each bit is not required. In addition, high speed coincidence/noncoincidence detection is possible because the delay time of the AND circuit is eliminated.

A comparator according to the various embodiments of the invention as described hereinabove offers a number of advantages, as follows. (1) A high speed comparison operation can be achieved by effectively integrating the sense amplifier and the comparator. (2) A high speed, multiple bit comparison operation can also be achieved in a relatively small hardware area because a wired OR gate that eliminates the need for the AND gate required in the prior art can be formed. (3) Sense amplifier input impedance conversion and bipolar transistor saturation prevention can also be achieved with a relatively small hardware configuration. (4) In addition, the operation of the memory circuit can be stabilized.

As a result, a comparator according to the present invention can thus be used with great effectiveness in semiconductor integrated circuit devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A comparator for comparing, in response to an activation signal, voltages of first and second signals in complement with voltages of third and fourth signals in complement, comprising:
   a first bipolar transistor for receiving said third signal to a base thereof;
   a second bipolar transistor for receiving said fourth signal to a base thereof;
   a first FET for receiving said second signal to a gate thereof, said first bipolar transistor and said first FET being connected in series to form a first current path;
   a second FET for receiving said first signal to a gate thereof, said second bipolar transistor and said second FET being connected in series to form a second current path, said first current path and said second current path connected in parallel;
   a switching FET having a drain connected to emitters is of said first and second bipolar transistors and a source connected to ground, and being turned on during when said activation signal is in a first state;
   a load resistor means connected to a junction of drains of said first and second FETS; and
   a precharge means for precharging collectors of said first and second bipolar transistors during when said activation signal is in a second state;
   whereby when said first and third signals are in the same state and, at the same time, the second and fourth signals are in the same state, said junction produces a first level signal, and when said first and third signals are in the opposite state and, at the same time, the second and fourth signals are in the opposite state, said junction produces a second level signal.

2. A comparator as claimed in claim 1, wherein said first and second FETS are N-channel MOSFETs.

3. A comparator as claimed in claim 1, wherein said first and second PZTB are P-channel MOSFETs.

4. A comparator as claimed in claim 1, further comprising:
   a third FET for receiving said third signal to a gate thereof, said third FET having drain and source, respectively, connected to collector and said base of said first bipolar transistor; and
   a fourth FET for receiving said fourth signal to a gate thereof, said fourth FET having drain and source, respectively, connected to collector and said base of said second bipolar transistor.

5. A comparator as claimed in claim 4, wherein said third and fourth FETs are N-channel MOSFETs.

6. A comparator as claimed in claim 4, wherein said third and fourth FETs are P-channel MOSFETs.

7. A comparator as claimed in claim 1, wherein said first and second signals are signals of a bit line pair from a first memory cell, and said third and fourth signals are signals of a bit line pair from a second memory cell.

* * * * *

UNITED STATES PATENT AND TRADEMARK OFFICE
CERTIFICATE OF CORRECTION

PATENT NO. : 5,289,414
DATED : February 22, 1994
INVENTOR(S) : Hatsuda

It is certified that error appears in the above-indentified patent and that said Letters Patent is hereby corrected as shown below:

Column 14, line 9, the word "is" should be deleted.
Column 14, line 14, the word "FETS" should be --FETs--.
Column 14, line 27, the word "FETS" should be --FETs--.
Column 14, line 29, "PZTB" should be --FETs--.

Signed and Sealed this

Thirtieth Day of August, 1994

Attest:

BRUCE LEHMAN

*Attesting Officer*  *Commissioner of Patents and Trademarks*